United States Patent [19]

Veneklasen et al.

[11] Patent Number: 5,876,902
[45] Date of Patent: Mar. 2, 1999

[54] RASTER SHAPED BEAM WRITING STRATEGY SYSTEM AND METHOD FOR PATTERN GENERATION

[75] Inventors: Lee H. Veneklasen, Castro Valley; William DeVore, Hayward; R. L. Smith, Oakland, all of Calif.; Robin Teitzel, Portland, Oreg.

[73] Assignee: Etec Systems, Inc., Hayward, Calif.

[21] Appl. No.: 789,247

[22] Filed: Jan. 28, 1997

[51] Int. Cl.⁶ .......................................... G03C 5/00
[52] U.S. Cl. ..................... 430/296; 430/942; 250/492.22
[58] Field of Search ................................ 430/296, 942; 250/492.22

[56] References Cited

U.S. PATENT DOCUMENTS

| | | | |
|---|---|---|---|
| 3,900,737 | 8/1975 | Collier | 250/492.2 |
| 4,879,605 | 11/1989 | Warkentin | 358/296 |
| 5,393,987 | 2/1995 | Abboud | 250/492.22 |

FOREIGN PATENT DOCUMENTS

WO 94/28574  12/1994  WIPO .

OTHER PUBLICATIONS

Muray, et al., "Address data reduction and lithography performance of graybeam writing strategies for raster scan mask generation", Journal of Vacuum Science & Technology: Part B, vol. 12, No. 6, Nov./Dec. 1994, pp. 3465–3472.

Veneklasen, "Optimizing electron beam lithography writing strategy subject to electron optical, pattern, and resist constraints", Journal of Vacuum Science and Technology: Part B, vol. 9, No. 6, Nov./Dec. 1991, pp. 3063–3069.

Primary Examiner—Christopher G. Young
Attorney, Agent, or Firm—Skjerven, Morrill, MacPherson, Franklin & Friel LLP; Norman R. Klivans

[57] ABSTRACT

A hybrid exposure strategy for pattern generation uses wide field raster scan deflection and a uniformly moving stage to expose long stripes. Periodic analog wide field magnetic scan is augmented by a high speed electrostatic retrograde scan to keep the beam stationary during exposure of rectangular flash fields. The system's data path utilizes a pattern represented in a rasterized format. Intermediate vector data bases are created using fracture rules that limit feature and hierarchical cell size of to be smaller than overlapping fringes of stripe data fields. Rectangular flash fields are employed with each field being a 1 by n array of writing pixels. The length, origin position and dose of line shaped beam flashes can be varied to allow patterns to be exposed on a design grid much smaller than a writing pixel. The length, origin position and dose data for each flash is derived from a rasterized data format using a decoder device. In this manner multiple writing pixels are exposed simultaneously without compromising resolution or diagonal line edge roughness, thus enhancing exposure rate. A high flash rate is assured by including astigmatic illumination to maximize beam current, and leveraged co-planar blanking and shaping deflection to minimize drive voltages.

7 Claims, 9 Drawing Sheets

RASTER SHAPED BEAM WRITING STRATEGY SYSTEM AND METHOD FOR PATTERN GENERATION

BACKGROUND

1. Field of Invention

This invention relates generally to a lithographic system for pattern generation. More specifically it relates to a lithographic system having a raster scanned, shaped beam writing strategy for exposing a pattern.

2. Description of the Related Art

Lithographic systems typically generate or expose patterns by controlling the flow of energy from a source to a substrate coated with a layer sensitive to that form of energy. Pattern exposure is controlled and broken into discrete units commonly referred to as flashes, wherein a flash is that portion of the pattern exposed during one cycle of an exposure sequence. Flashes are produced by allowing energy from the source, for example light, electron or other particle beams, to reach the coated substrate within selected pattern areas. The details of flash composition, dose and exposure sequence used to produce a pattern, and hence the control of the lithographic system, make up what is known as a writing strategy.

Writing strategies strive for both the highest pattern throughput and best pattern quality. However, often highest throughput is only possible at the cost of degraded pattern quality. For example, smaller flashes usually result in better pattern quality but lower throughput. Thus an optimized writing strategy is one that makes the best compromise for each specific task. Both vector scan and raster scan writing strategies strive for the same goals, therefore a combination of elements of each may result in a better compromise.

A traditional raster scan writing strategy employs a uniform periodic raster scan, much like a television. A mechanical stage moves a substrate uniformly in a direction orthogonal to the direction of the uniform scan of an energy beam. In this manner a pattern is composed on a regular grid with a regular scan trajectory resulting from the orthogonal movement of the stage and beam. When the beam is positioned over a grid site requiring exposure, the beam is unblanked and the underlying site exposed. Only the amount of dose, or energy, at each site is varied as required. Hence, exposure data can be organized in a time sequence corresponding to the regular scan trajectory, and only the dose for each site need be specified. The distinguishing characteristics of a traditional raster scan writing strategy are a small round beam exposing one site at a time, a periodic scan moving sequentially to each site of a grid and a rasterized representation of data corresponding to the required dose for each site or "pixel" of the grid.

On the other hand, in a typical vector scan writing strategy, the beam is positioned only over those sites that require exposure and then unblanked to expose the site. Positioning is accomplished by a combination of stage and beam movement in what is often referred to as a semi-random scan. Thus, data must be provided that includes both the dose and position of each flash or site exposed. Frequently, vector scan strategies use a variable shaped beam, that is a beam capable of having a different size and/or shape for each flash. The pattern is then composed from these variable shapes. A shaped beam is capable of exposing multiple pixel sites simultaneously instead of one pixel site at a time as in a raster scan writing strategy. Where a variable shaped beam is used, the data must additionally include the location, size and shape for each flash. Thus the distinguishing characteristics of traditional vector scan writing strategies are a variable shaped and sized beam exposing multiple pixel sites in a single flash, a semi-random scan encompassing only those portions of a pattern to be exposed, and a vectorized representation of data including the location, size, shape and dose of each flash.

Important to both raster and vector scan writing strategies is the pattern coverage rate, (R) specifying the pattern area exposed per second of writing time. R is normally expressed having the dimensions of square centimeters per second ($cm^2$/sec). Both writing strategies strive to have a high R. High coverage rates imply high flash rates, while pattern integrity or quality implies that small pixels be used to define pattern shapes. Thus with a limited flash rate, optimization of a writing strategy favors exposure of as many pixels as possible during each flash.

As known, flash rate (F) in Hertz (Hz) and energy or flux density (J) expressed in Amperes per square centimeter (Amp/$cm^2$), are limited by both electronics and the beam optics. The relationship between R, F and J can be expressed by looking at a lithography system that exposes a pattern on a substrate having an energy sensitive layer or resist requiring an amount of energy or dose D expressed in microCoulombs per square centimeter ($\mu C/cm^2$) and that uses N separate beams in p separate exposure passes. We define $\Delta$ to be an address unit, or the period of a grid upon which the pattern is composed. Each element of the grid is called an "address element" which covers an area $\Delta^2$ ($cm^2$). If each flash can expose an average of $n_x$ address elements along the x direction and $n_y$ address elements along the y direction, and requires one flash period 1/F (sec) to expose the flash, the coverage rate is seen as subject to the following two constraints:

$R < N\ n_x\ n_y\ \Delta^2\ F/p$ $R < N\ n_x\ n_y\ \Delta^2\ J/D$ which implies a current density requirement of J=DF/p The size $\Delta$ of an address element typically determines pattern placement precision. The size of a beam used to expose an address element usually determines pattern edge resolution and control of critical feature sizes. As known, beam size must be at least as large as an address element, therefore pattern quality considerations limit pixel size. With these limitations, it is seen that writing strategies should strive to maximize the number of address elements exposed during each flash.

Both vector and raster scan writing strategies have advantages and disadvantages. Vector scan strategies can often write patterns faster because larger pieces of the pattern are exposed in each flash using shaped beams. In addition, vector scan strategies can offer arbitrarily fine placement precision (as distinguished from accuracy) by adding least significant bits to digital to analog converters (DACs) used for beam deflection. However, the semi-random scan trajectory characteristic of a vector scan strategy usually requires several levels of precision DAC driven-electronics that must be fast, stable and well calibrated to avoid "butting" or "stitching" errors between deflection fields. Such electronics are sophisticated hence add to system cost and complexity. Also, vector scan flash rates are typically slower due to settling time required between the relatively large beam deflections of the semi-random scan trajectory. In addition, where beam shaping is employed, dose errors due to shaped beam size and shape variations can be generated. Finally, since vector scan systems usually spend more time exposing small deflection fields before moving on to other areas of the pattern, heating of the resist is more localized and thus is a larger threat to pattern quality.

Raster scan strategies are relatively simple and accurate because a minimum number of periodic deflections (stage motion and scan) are used to position the beam. However, since a single beam exposes one pixel at a time in a serial manner, raster scan strategies tend to have a low coverage rate and/or a relatively coarse address grid.

Thus it would be desirable to develop an improved writing strategy that combines the advantages of a vector scan strategy with those of a raster scan strategy. It would also be desirable to develop an improved writing strategy that made the aforementioned combination using a rasterized representation of the pattern for exposure. Finally it would also be desirable to develop an improved writing strategy capable of using methods for the correction of proximity effects during run-time.

SUMMARY

In the raster shaped beam writing strategy of the present invention, a beam is periodically scanned over a substrate in a first direction while the substrate is moved at a constant velocity in a second orthogonal direction. A small amplitude sawtooth retrograde scan is applied to the beam for accurate beam positioning during each flash. This retrograde scan causes the beam to appear to move in a stepwise fashion, periodically pausing at origin locations on a flash field grid having a rectangular unit cell or "flash origin field". The flash origin field is advantageously defined as being one or more address units high by many more address units long. In this manner, the aspect ratio (length to height) of the flash origin field is greater than one. Within each flash origin field, a portion of a pattern area is exposed using a line shaped beam. The line shaped beam has a height equal to the height of the flash origin field and a length no greater than the length of the flash origin field. The reference origin at a corner of the line shaped beam flash can be positioned anywhere within the flash origin field using vector deflections alone, or by using a combination of vector deflection and dose modulation. The origin position, length and exposure dose of the line shaped beam flash are controlled in such a way to allow patterns to be composed upon an address grid that is much smaller than the flash, thus increasing throughput. The line shaped beam may overlap into an adjacent flash origin field, allowing features with rectilinear and diagonal edges to be composed using a minimum number of flashes.

Data controlling the length, location and flash time for the line shaped beam is derived from a rasterized representation of the pattern. This rasterized representation is formed from intermediate vectorized data bases that limit feature size and hierarchical cells to be smaller than overlapping fringes of stripe data fields. Portions of this rasterized pattern representation are stored in a temporary storage device and converted to line shape flash data using a decoder device in the manner of the present invention. Scaling of features within the rasterized pattern representation is performed within a data path using a lookup table that advantageously allows rasterization independent of the size of features. In some embodiments of the present invention, corrections for proximity effects can be advantageously made during run-time.

Rasterized data consists of dose levels for square "writing pixels" in a Graylevel map that represents the pattern. Data from up to 32 writing pixels adjacent the flash origin field is used to compose each flash. Typically, the flash origin field is sixteen pixels in length, although other appropriate numbers of pixels can be employed. In this manner, the line shaped beam or flash field can be up to sixteen simultaneously exposed pixels long, greatly increasing coverage rate. Since the height of the flash is small, sloped lines are composed without excessive roughness.

A high current density, line shaped beam is formed with electron optics adapted to embodiments of the raster shaped beam writing strategy of the present invention. The electron optics include a thermal field emission source, astigmatic shaped aperture illumination to improve illumination uniformity, and electron optical leveraging of orthogonal shaper and blanker deflections to support high flash rates using low voltage terminated driver circuits.

BRIEF DESCRIPTION OF THE DRAWINGS

For ease of understanding and simplicity, common numbering of elements within the illustrations is employed where the element is the same between illustrations.

DETAILED DESCRIPTION

Embodiments of the present invention will be described with reference to the aforementioned figures. These drawings are simplified for ease of understanding and description of embodiments of the present invention only. Various modifications or adaptations of specific methods and/or structures may become apparent to those skilled in the art as embodiments of the present invention are described. All such modifications, adaptations or variations that rely upon the teachings of the present invention, and through which these teachings have advanced the art, are considered to be within the spirit and scope of the present invention.

Preparation and processing of pattern data depends upon the writing strategy employed. Where a raster scan strategy is employed, data is converted from vector format to raster format while exposure is occurring. This data conversion is performed in run-time as the volume of all rasterized data required is too large for fast retrieval during exposure.

The conversion starts with one or more intermediate pattern data bases, having a vectorized representation, that contain lists of sizes, shapes and locations of figures. During what are commonly referred to as "Post Processing", these lists are sorted to enhance run time rasterization. For example, a list can be sorted into a hierarchical format of groups of figures. In this manner the hierarchical list can be specified once and used many times at different sites within the pattern. In addition, geometry and delivery sequence of the data is processed to match the exposure strategy selected and included in these pattern data bases.

In some "Post Processing" operations, the data is additionally modified to correct for scattering and heating proximity effects. As known, these corrections can take many hours when applied to vectorized data representations. In a related application "METHOD AND APPARATUS FOR RUN-TIME CORRECTION OF PROXIMITY EFFECTS IN PATTERN GENERATION", by Veneklasen et al., Ser. No. 08/789,246, now U.S. Pat. No. 5,847,959 issued Dec. 8, 1998, a method and apparatus for performing these corrections after rasterization is presented. This application is incorporated by reference herein. In some embodiments of the present invention, the teachings of this related application are incorporated and corrections calculated during run-time.

Figure 3A:
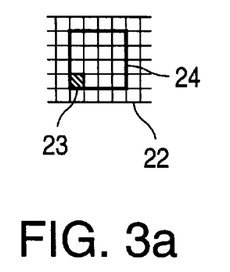
FIGS. 3a, 3b and 3c illustrate examples of grids, scan fields and data fields used to compose a pattern using an apparatus and writing strategy of an embodiment of the present invention.
Figure 3B:
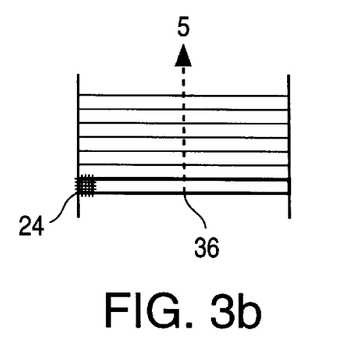
Figure 3C:
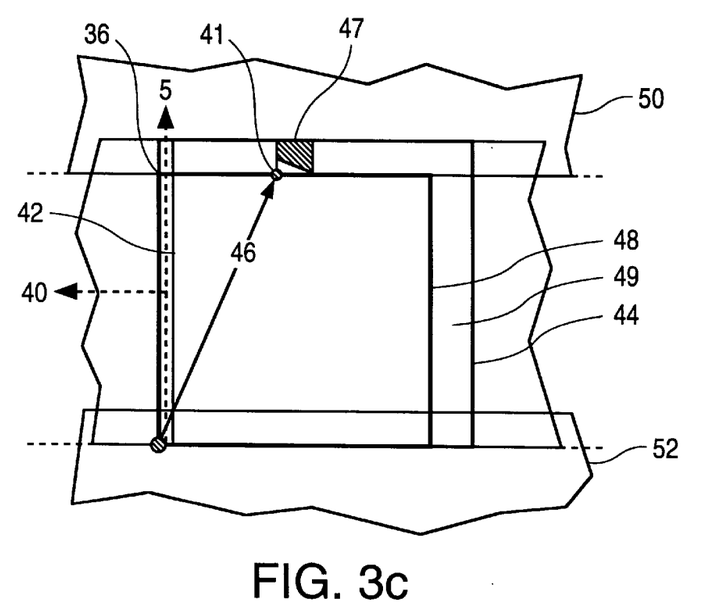

In some embodiments, stitching problems are minimized and proximity effect corrections are facilitated by including rasterized data from overlapping fringe regions surrounding the area being exposed. It is desirable to limit the size of figures and microcells to fit within this fringe, making it unnecessary to partition figures and microcells (see FIG. 3) at stripe boundaries. Thus the aforementioned intermediate data bases are created using postprocessing fracture methods that so limit figure size.

Figure 1A:
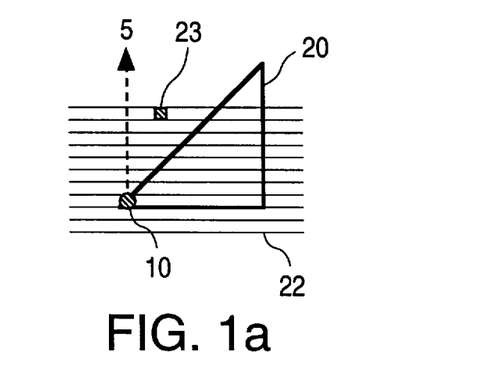
FIGS. 1a, 1b and 1c illustrate alternate prior art raster scan writing strategies.
Figure 1B:
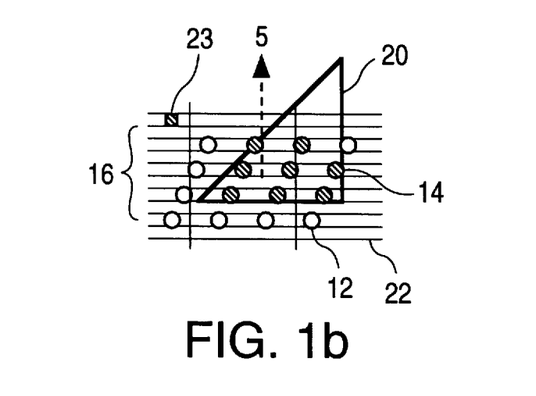
Figure 1C:
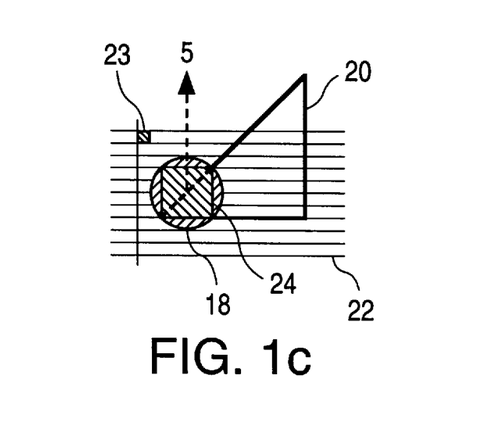

FIGS. 1a, 1b and 1c each illustrate an alternate prior art raster scan writing strategy. FIG. 1a depicts a basic raster scan writing strategy which is the subject of U.S. Pat. No. 3,900,737 issued Aug. 19, 1975 to Collier et al., and is incorporated herein by reference. A round beam 10 is shown moving in scan direction 5 over an address grid 22 of address elements 23. A feature 20 of a pattern is aligned to address grid 22. Beam 10 (shown as a solid dot to signify that it is unblanked) is exposing that portion of feature 20 it overlies. In this manner, each address element 23 of address grid 22 within feature 20 is exposed one at a time.

FIG. 1b is a simplified representation of a multiple beam raster scan writing strategy that is the subject of U.S. Pat. No. 4,879,605 issued Nov. 7, 1989 to Warkentin et al., which is incorporated herein by reference. An array of beams 16 is shown moving in scan direction 5 over address grid 22 of address elements 23. Each of the individual beams 12, 14 is independently controllable. Thus, as beams 14 overlie feature 20 they are unblanked, while beams 12, not overlying feature 20, are blanked. In this manner feature 20 of the pattern is generated. Thus using an array of beams 16 having sixteen individual beams 12, 14, it is theoretically possible to expose feature 20 at a rate sixteen times faster than that of the basic system depicted in FIG. 1a.

FIG. 1c depicts a simplified representation of a Graybeam raster scan writing strategy that is the subject of U.S. Pat. No. 5,393,987 issued Feb. 28, 1995 to Abboud et al., and incorporated herein by reference. Graybeam 18 is shown moving in scan direction 5 over address grid 22 of address elements 23. Since Graybeam 18 overlaps a plurality of address elements 23 it is possible for a portion of Graybeam 18 to overlie feature 20 while another portion does not. Exposure of feature 20 is then accomplished by varying the dose delivered by Graybeam 18. Varying the exposure dose shifts the location of edges of feature 20, allowing feature 20 to be composed on address grid 22 which is smaller than Graybeam 18. As shown, Graybeam 18 is exposing a square writing pixel 24 having a 4×4 array of address elements 23 therein. As with array 16 of FIG. 1b, Graybeam 18 can expose multiple address elements 23 at a time, and where array 16 and Graybeam 18 each contain the same number of address elements 23, theoretical exposure rate enhancement is equivalent. Comparing array 16 of FIG. 1b, to Graybeam 18, the latter has reduced pattern resolution due to a large beam size, however Graybeam 18 has the advantage of requiring only a single source of electrons or other particle beams.

Figure 2:
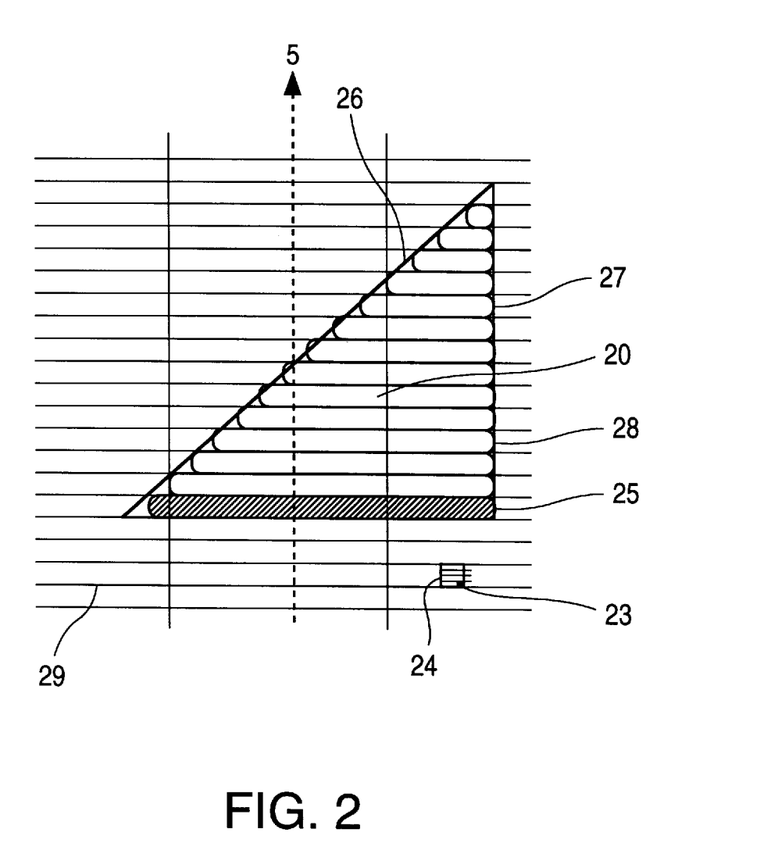
FIG. 2 shows a raster shaped beam formed using an apparatus and writing strategy of an embodiment of the present invention.

FIG. 2 shows a raster line-shaped beam formed using an apparatus and writing strategy of an embodiment of the present invention. Line-shaped beam 25 is shown moving in scan direction 5 over a writing pixel grid 29. Each unit or writing pixel 24 of writing pixel grid 29 is an array of smaller address elements 23. Line-shaped beam 25 exposes all or parts of a number of writing pixels 24 to compose feature 20. Thus as sloped edge 26 approaches vertical edge 27, the origin and length of subsequent line shaped flashes 28 are changed. As will be discussed in detail, in practice line shaped beam flash 25 can be advantageously modified to expose feature 20 with resolution comparable to the writing strategies of FIGS. 1a or 1b and throughput higher than the strategies of FIGS. 1b or 1c.

FIGS. 3a, 3b and 3c illustrate a typical example of grids, scan fields and data fields used to compose a pattern using an embodiment of the present invention. In FIG. 3a a writing pixel 24 is shown overlying address grid 22. As shown, writing pixel 24 consists of an array of address elements 23 overlaid on address grid 22. Address elements 23 range in size from approximately 5 to 20 nanometer squares and are the basic building block upon which pattern feature 20 (FIG. 2) is composed and pattern edges 25 and 27 (FIG. 2) are placed. As depicted, writing pixel 24 is a 4×4 array of address elements 23 and correspondingly has a size ranging from 20 to 80 nanometer squares. In the special case where the lithography system is a binary raster scan system, one skilled in the art will realize that writing pixel 24 is identical to address element 23. Other numbers of address elements 23 can be used to form a writing pixel 24 where appropriate, and these alternate embodiments of writing pixel 24 are understood to be within the scope and spirit of the present invention. The 4×4 array depicted in FIG. 3a allows for shifts in pattern edges in single address element 23 increments using four dose levels specified as in a Graybeam rasterized database.

FIG. 3b shows a rectangular flash origin field 36 having a 1×16 array of writing pixels 24 overlying writing pixel grid 29. As seen in FIG. 3a, each writing pixel 24 has an array of address elements 23. Flash origin field 36 is oriented having a long axis orthogonal to periodic scan direction 5. The origin of line shaped beam flash 25 (not shown) lies within flash origin field 36. The 1×16 array of writing pixels 24 shown, can range in size from approximately 320×20 nm to approximately 1280×80 nm where each writing pixel 24 is between approximately 20 to 80 nanometer squares. It is important to realize that flash origin field 36 is defined by the writing strategy and apparatus employed, and while a 1×16 array is depicted herein, any other appropriate flash origin field 36 containing more than one writing pixel 24 can be advantageously employed. Flash origin field 36 is fixed with respect to the regular periodic grid of the apparatus, and only one line-shaped beam flash having an origin within flash origin field 36 can be made per line scan.

Turning now to FIG. 3c, scan fields and data fields used to compose a pattern using an embodiment of the present invention are shown. As known for the basic raster beam 10 of FIG. 1a, stage movement and beam scanning are combined to allow exposure of each flash field 36. In embodiments of the present invention, the beam is scanned along scan direction 5 while stage motion is orthogonal along stage direction 40. A scan stripe 42 is an array of flash origin fields 36 (FIG. 3b) exposed during a scan. While only a single scan stripe 42 is illustrated in FIG. 3c, it should be understood that a plurality of stripes 42 form a stripe data segment 44. Each stripe data segment 44 is defined in scan direction 5 by the height of scan stripe 42. In stage direction 40, data segment 44 is defined by the amount of memory available for temporary storage of the exposure data. Where each flash origin field 36 is a 1×16 array of writing pixels 24, scan stripe 42 is typically 8192 flashes or pixels in scan direction 5, requiring scan amplitudes ranging from approximately 164 to 656 microns ($\mu$m). Where sixteen megabytes of temporary data storage is available, stripe data segment 44 would contain approximately 400 scan stripes 42 to define the dimension of data segment 44 in the direction of stage direction 40.

As depicted, stripe data segment 44 has fringes or segment overlap regions 49. A portion of segment overlap 49 is shown overlying an adjacent stripe data segments 50 and 52. The overlap of adjacent data segments 50 allows a figure or microcell field 47 to be composed within either data segment 44 or 50. Microcell field 47 is a figure that was described in the previously discussed intermediate data base as being a polygon or group of polygons having a size limited to fit within overlap regions 49. Each microcell field 47 has an origin 41. The position of microfield 47 is then described by a figure origin vector 46 which relates origin 41 to figure origin field 48 and stripe data segment 44 as depicted. Where origin 41 is within figure origin field 48, microcell 47 is entirely exposed by scan stripe 42 of stripe data segment 44. However, where origin 41 is within a portion of segment overlap 49, for example that segment overlap 49 that overlies adjacent data segment 50, microcell 47 is entirely exposed by a scan stripe (not shown) of data segment 50. Figure or microcell 47 never has to be exposed using flashes in two different scan stripes 42. In this manner, embodiments of the present invention advantageously write or expose a pattern without regard for stripe boundaries. The possibility of exposing different parts of critical features or microcells 47 in different scan stripes 42 is avoided and stripe butting errors are reduced.

Figure 4:
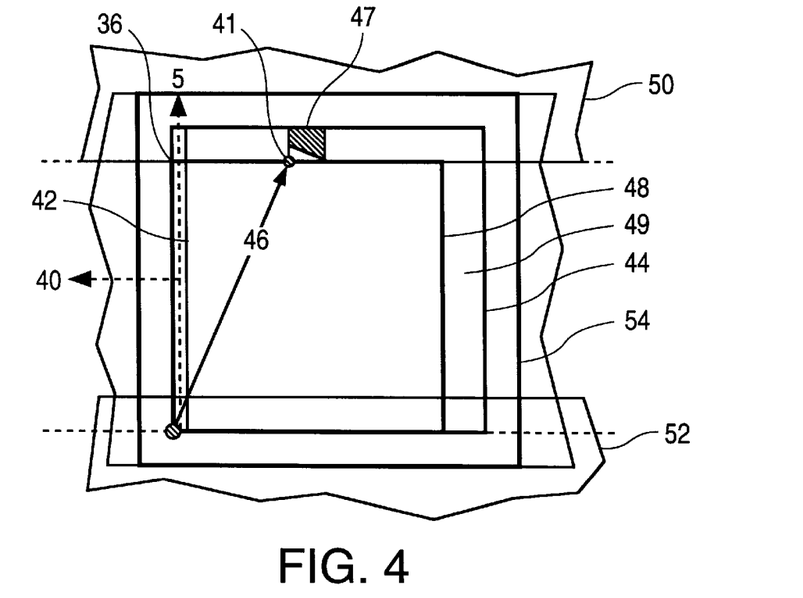
FIG. 4 is a simplified representation of an expanded figure origin field of an embodiment of the present invention.

Turning now to FIG. 4, extension of the principle illustrated in FIG. 3c is shown. An expanded figure origin data field 54 is shown to include a region wider than the maximum range of scattering and resist heating interactions for stripe data segment 44. Using data from expanded figure origin data field 54, some embodiments of the present invention can calculate corrections for proximity effects during run-time in the manner of aforementioned related application "METHOD AND APPARATUS FOR RUN-TIME CORRECTION OF PROXIMITY EFFECTS IN PATTERN GENERATION", Ser. No. 08/789,246, now U.S. Pat. No. 5,847,959 issued Dec. 8, 1998. While dose data for all flashes that can influence flashes within data segment 44 are included within expanded data field 54, it should be realized that only flashes required for figures 47 having origin 41 within figure origin field 48 are exposed within stripe data segment 44.

Figure 5:
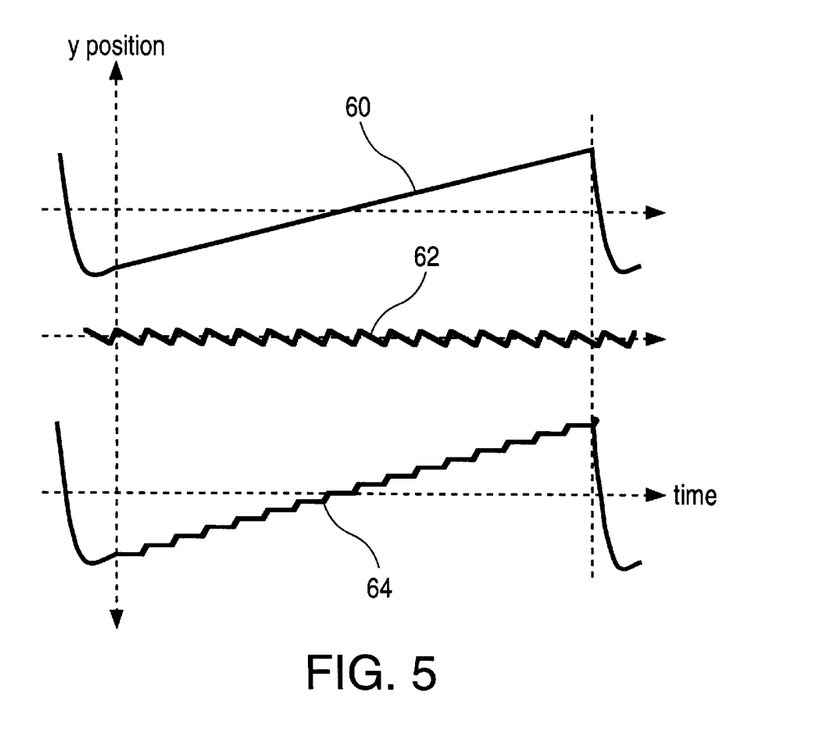
FIG. 5 is a simplified representation of a widefield deflection waveform of the present invention.

The beam is scanned in a stepwise, periodic manner, pausing at each figure origin field 36 (FIG. 3b) for a fixed flash cycle time using the combined action of an analog magnetic scan and a retrograde electrostatic scan. Some embodiments of the present invention create a staircase deflection trajectory 64 as shown in FIG. 5. Analog wide field scan 60 is plotted showing amplitude or y-position versus time The amplitude of analog scan 60 is typically 8192 writing pixels or approximately 164 to 656 $\mu$m. A high speed sawtooth scan 62 having an amplitude of one writing pixel and of a period equal to one flash cycle (typically 10 nanosecond for a flash rate of 100 MHz) is superimposed upon analog scan 60. The effect of these two deflections combines to create staircase deflection trajectory 64 which results in the stepwise, periodic scan described.

When each scan is complete, one of two things happens. If all the necessary flashes within scan stripe 42 (FIG. 3c) are exposed, the beam advances the length of one flash origin field (FIG. 3b) and another scan begins. If the feature or pattern requires more than one shaped beam exposure within any flash field, the entire scan is retraced. During retrace, any remaining flashes are exposed and the beam advances once all remaining flashes are completed. This retrace feature of the writing strategy of the present invention is only necessary when an x-axis period between any two features in a scan line is less than the length (typically 16 writing pixels) of flash origin field 36 (FIG. 3b). As an alternative to retracing scans, retrograde sawtooth scan 62 can be used to hold the beam for two or more cycles at any flash field 36 (FIG. 3b). However, repeated use of this "error correction" alternative along a given scan would build up cumulative error and eventually detract from the advantages of a periodic scan.

Figure 6A:
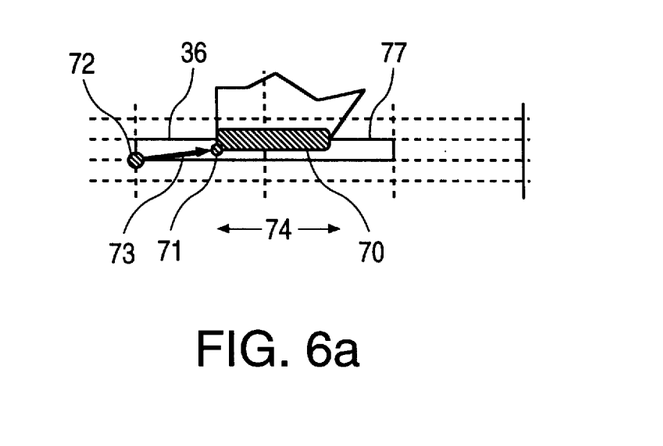
FIGS. 6a and 6b illustrate alternative pattern exposure methods of embodiments of the present invention.
Figure 6B:
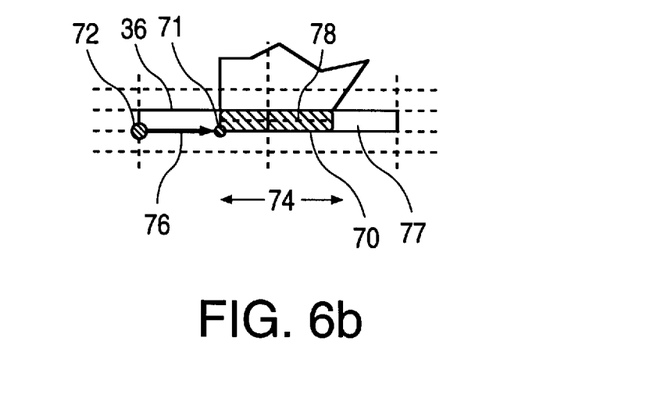

Turning now to FIGS. 6a and 6b, alternate pattern exposure embodiments are shown. Either embodiment advantageously allows pattern data to be composed on the finer resolution of address grid 22 (FIG. 3a). In FIG. 6a, an origin 71 of line shaped beam 70 is shown positioned at a distance from origin 72 of flash origin field 36. This distance and direction of displacement are indicated by flash origin vector 73. Line shaped beam 70 is represented in FIG. 6a as equal in length to that of flash origin field 36. However, length 74 of shaped beam 70 can be any number of address elements 23 between 0 and the full length of flash origin field 36, in this case 64 address elements 23. It has been found desirable in some embodiments of the present invention to have flash origin fields 16 writing pixels long, although other appropriate lengths can be used, for example 8 writing pixels. When line shape origin 71 is displaced from field origin 72, the position and length of line shaped beam 70 is adjusted in address unit increments. In the embodiment of FIG. 6a, the origin 71 of line shaped beam flash 70 is deflected from origin 72 of flash origin field 36 using very low amplitude 0 to 64 address unit "microvector" deflections along the x axis and 0 to 4 address unit "microvector" deflections along the y axis. Position of line shape origin 71 and length 74 of shaped beam 70 can be changed between each flash cycle.

FIG. 6b shows another pattern exposure embodiment where Graybeam flash duty cycle modulation is used for positioning figure edges (not shown). As discussed with respect to FIG. 6a, length 74 of the line shape beam 70 can range from, for example, 0 to 16 pixels or 0 to 64 address units. Origin 71 can be deflected in one address unit step to any of 64 sites along the x axis. In the embodiment of FIG. 6b, four different dose levels 78 (indicated here by cross hatching) shifts edges in one address increment steps along the y axis using Graybeam methods.

In both FIG. 6a and 6b, it should be noted that line shaped beam 70 can expose pixels in an adjacent flash field 77. While these pixels in adjacent field 77 can alternately be exposed in a subsequent scan, embodiments of the present invention advantageously expose them in this scan. Thus, a sixteen writing pixel flash length and sixteen pixel origin microvectoring allow exposure of any sixteen of the thirty-two possible writing pixel sites in the two adjacent flash fields 36, 77. This overlapping of scan line exposures is a feature of embodiments of the present invention that effects throughput and accuracy. Eliminating hard scan line boundaries avoids partial exposures of narrow features allowing features to be composed with fewer flashes. For example, if flash 70 had to remain within the boundaries of the flash origin field 36, equal line and space periods of less than 64 address units would often require retrace scans. When flash 70 is allowed to extend into adjacent flash field 77, all line and spaces periods greater than 128 address elements are composed without retrace, regardless of the relationship between flash origin field grid 36 and pattern detail. Thus the overlapping field procedure of embodiments of the present invention allow for composing patterns with line shapes at a coverage rate up to twice as high as a non-overlap procedure.

Any data path that can supply the necessary shape length, microvector position and dose data required to specify each flash can be used in the embodiments of the present invention. However, raster shaped beam strategy is particularly effective when used in conjunction with high speed raster scan data path electronics that generate rasterized data by parallel processing. For example, U.S. Pat. Nos. 4,806,921 and 4,879,604 assigned to the same assignee (ATEQ/Etec) and incorporated by reference herein, are examples of parallel processing rasterization data paths originally intended for multiple Graybeam systems that can be adapted or easily modified to control a line shaped beam of an embodiment of the present invention as described herein.

A rasterized data base specifies a binary or graylevel dose for each writing pixel 24 (FIG. 3c) in the pattern. This data is generated in run time and temporarily stored in a pixel data buffer containing all the data for one stripe data segment 44 (FIG. 3b). The raster shaped beam (RSB) strategy requires flash data specifying origin position 71 (FIG. 6a) of flash 70 (FIG. 6a) within flash origin field 36 (FIG. 6a), length 74 (FIG. 6a) of flash 70, and dose. In the 1×16 pixel flash field 36 of FIG. 6a, the data for overlapping line shaped flashes is derived from a row of thirty-two side by side writing pixels. Data for sixteen pixels within the current flash origin field is updated each flash cycle, while data for sixteen pixels in the adjacent flash field is obtained by modifying data loaded during the previous scan.

Figure 7:
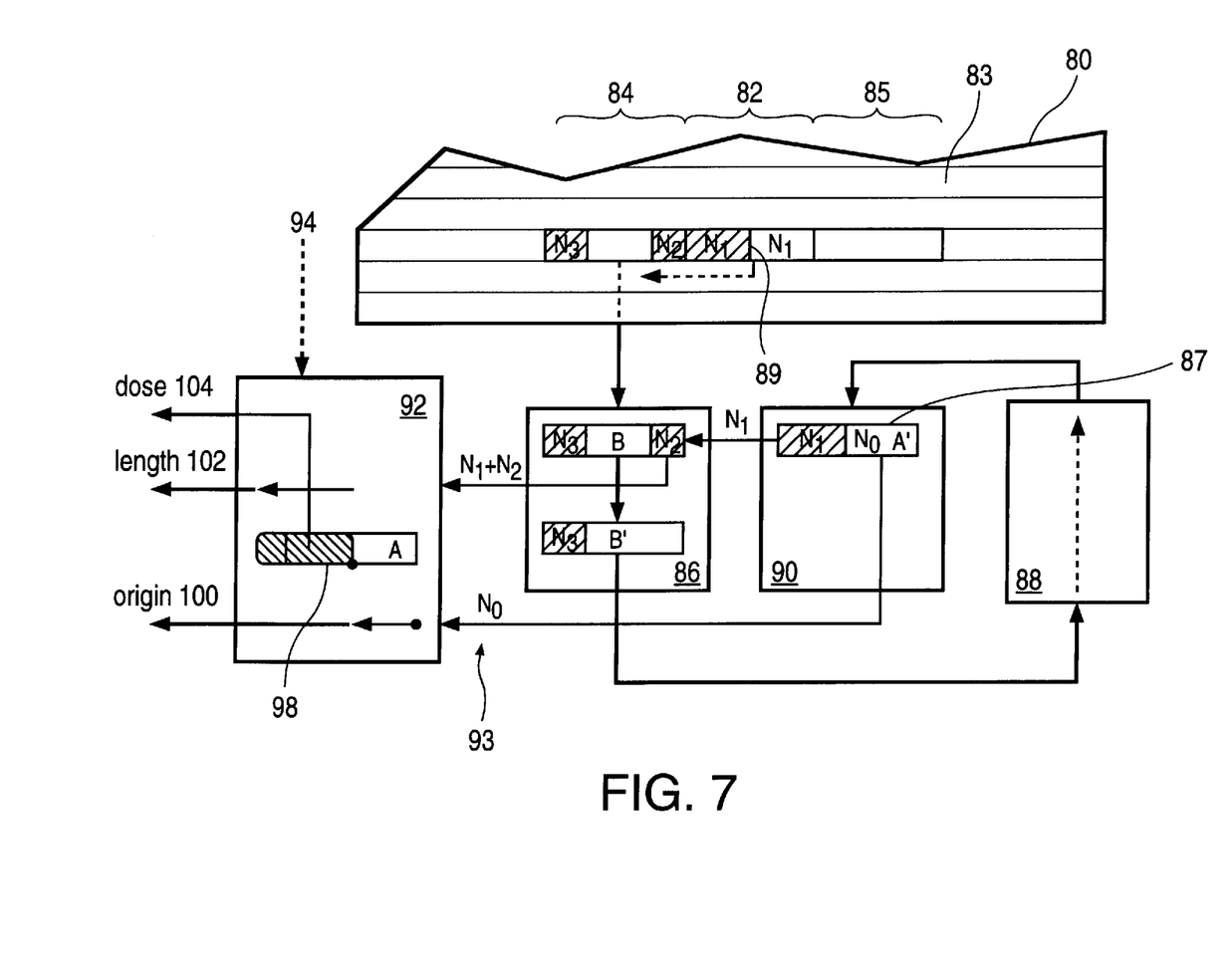
FIG. 7 is a simplified representation of a decoder used to convert rasterized pattern data to microvector data in the manner of an embodiment of the present invention.

FIG. 7 shows a block diagram for an embodiment of a decoder that reduces rasterized data to line shaped beam microvector data. In the example of this embodiment, suited for 16×1 pixel flash fields and binary dose levels, input to the decoder is binary dose data for groups of sixteen side by side writing pixels. The binary dose data is stored in pattern buffer memory 80 in columns containing the data for sixteen pixel flash fields in first scan line 82 depicted between scan line grid boundaries 83, and in an adjacent second scan line 84. Data for scan lines 82 and 84 are read out sequentially. A typical bit map configuration for two adjacent flash fields is shown with the exposed pixels cross hatched marked for clarity.

Data is extracted from pattern buffer memory 80 in groups of sixteen writing pixels per flash. To begin the cycle that will compose origin and shape length data for scan field 82, data for the adjacent scan field 84 is read from buffer 80 and loaded into processor 86. Processor 86 counts the number of successive exposed pixels starting from the point adjacent scan field 82. This data will be used later to determine overlapping flash length.

Modified pixel data field 87, that has been read from scan field 82 in the previous scan cycle and stored for one scan line cycle, is moved from a shift register 88 into a processor 90. Processor 90 counts the number of successive unexposed pixels starting from the point adjacent scan field 85. This data is the deflection of the origin of the line shaped beam or flash in that flash field. Processor 90 also counts the number of successive exposed pixels (cross hatched marked for clarity) after an edge 89 that is the boundary between exposed and unexposed pixels. This count data is transferred to processor 86, and added to the output of processor B to determine the length of the flash. If the flash ends in scan field 82, the output of processor 86 is zero. If the flash doesn't end in scan field 82, the sum of pixels can be either greater than or less than sixteen. When the sum of pixels is less than sixteen, all exposed pixels in scan field 84 are included in the flash having an origin in scan field 82. When the sum of pixels is greater than sixteen, then the pixels in excess of sixteen that are in scan field 84 create a new flash with a new origin. Thus modified output data is loaded into the shift register 88 containing only those pixels in scan field 84 that need to be exposed.

In the next flash cycle, exposed pixels are erased (set to zero) in processor 86 and a modified set of pixel data transferred to shift register 88 for temporary storage. This modified data emerges one scan line later to be inserted into processor 90 during the next scan cycle. This cycle continues until all scan lines in buffer 80 have been exposed. In the meantime, a second buffer (not shown) is being refilled from the parallel processors creating rasterized data, allowing data segments to be exposed without interruption.

Lookup table 92 is loaded with calibration data 94 specifying deflections and blanker cycles appropriate for the resist process and patterning task. Flash data is expressed in dimensionless multiples of address units, and dimensionless fractions of nominal dose to simplify calculations. Calibration data 94 is then used to convert dimensionless data to microvector deflections, shaper deflections needed to compose the pattern, and the flash duty cycles necessary to expose it properly.

The result of the calculation of scan origin and flash length is used as address data 93 for lookup table 92 that provides an output for deflection and shaping. Thus flash 98 has an origin 100, a length 102 and a dose 104 generated in the manner described.

Provided the entire wide field scan and feature composition grid structure (FIG. 3) is scaled together, (i.e. is based upon multiples of a single specified address unit), a dimensionless rasterized data base may be used for different sized patterns. Using lookup table 92 to convert from address units to deflection distances at the end of the data path advantageously adds scaling capability to the data path.

Those familiar with raster scan data path design will recognize that other decoder principles could be applied. For example, decoders can be devised to process Graylevel pattern representations using finer address structure. Such a decoder generates dose as well as origin and length vectors to position edges on an address structure smaller than the writing pixel.

Where embodiments of the present invention are employed for electron beam lithography systems, electron optics supporting the RSB strategy are beneficial to achieve high performance. As known, a shaped electron beam lithography column typically consists of an electron gun, intermediate beam shaping optics, a demagnification lens, and an overlaid objective lens and wide field deflection system.

Provision for turning the beam on and off (blanking) for all or part of the flash cycle is also typically required. In embodiments of the RSB writing strategy of the present invention, a line shaped beam having the proper length and origin position will be formed at very high speed using small microvector deflections. Blanking should be capable of modulating dose during very short flash times characteristic of embodiments of the RSB strategy. In addition, high current density is needed to support the flash rates possible with embodiments of the present invention.

Figure 8:
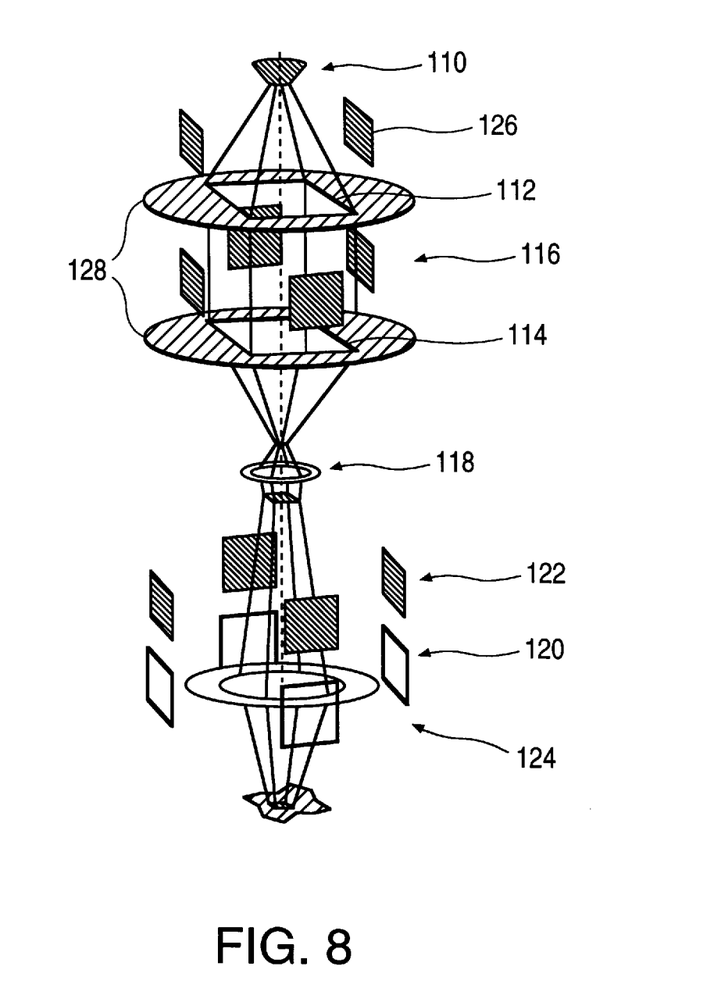
FIG. 8 illustrates a prior art column employed in a variable shaped beam pattern generation system.

FIG. 8 is a schematic drawing of a typical prior art variable shaped beam electron optics column specialized for vector scan writing strategy. A thermionic electron gun 110 illuminates a square upper shape aperture 112, whose image or shadow is projected upon a similar square lower shape aperture 114. The image of the upper shape is deflected by a two axis electrostatic deflector 116. After a demagnification lens 118, the image of the shape is deflected by wide field magnetic deflection coils 120, and subfield electrostatic deflectors 122 within the objective lens 124. Using very fast electrostatic deflectors 126, the beam may be blanked above the first shape. Two additional field lenses 128 are used to place images of the gun crossover at desired locations along the beam axis. There are other prior art column configurations that image the gun crossover instead of shape apertures. These optics often use thermal field emission (TFE) electron guns, and are specialized for raster or vector scan writing strategies using a Gaussian (as opposed to shaped) beam.

With the exception of wide field magnetic deflection optimized for raster scan, and very fast low voltage subfield deflections, the lower column optics configuration of an RSB optimized column is similar to FIG. 8. However, the middle and upper column optics are modified from that shown in FIG. 8 to support a high flash rate.

Figure 9:
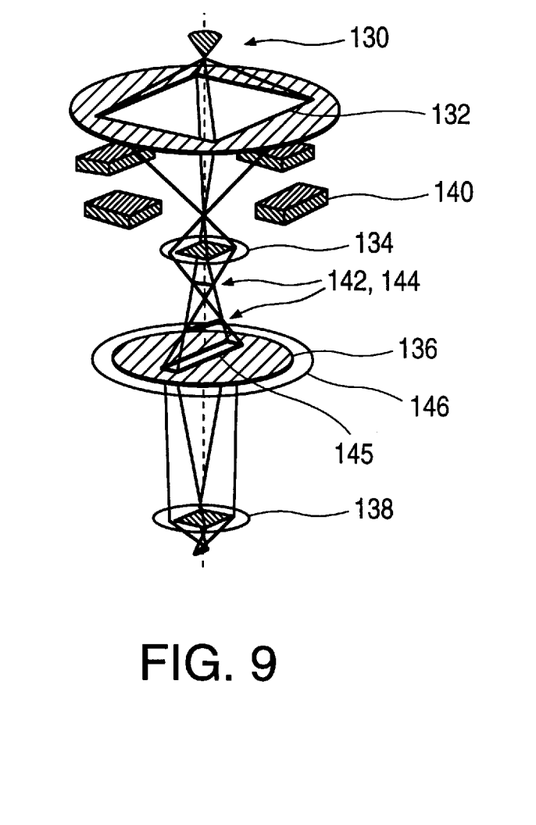
FIG. 9 is a simplified illustration of astigmatic line shaped beam optics of an embodiment of the present invention.

FIG. 9 shows a schematic of upper column optics modified for embodiments of the RSB writing strategy of the present invention. Raster shaped beam strategy requires a very small one axis variable shaped beam with very high current density. The upper column optics include a thermal field emission (TFE) electron gun 130, within which a square upper shape aperture 132 casts a shadow image that forms a well defined illuminating beam because the brightness and associated depth of field of TFE illumination is favorable. Below the gun is a collimator lens 134 which projects a shadow of the gun aperture upon a rectangular line shape aperture 136. Passing through a field lens 146 at the plane of the lower shape, the beam enters the pupil of a demagnification lens 138, and into the objective lens optics shown in FIG. 8.

A strong quadruple stigmator 140 is located within or above the collimator lens 134. In this manner, the lens is stronger in the long axis of the lower shape, and weaker in the short axis of the lower shape. Using stigmator 140, two astigmatic crossovers 142, 144 or line images of the TFE cathode in gun 130 are formed, and the beam illuminating rectangular lower shape aperture 136 is a rectangular shadow 145 of the gun aperture 132. After passing through the shape and field lens 146, the beam uniformly fills the demagnification lens pupil 138 as required to minimize lens aberrations and beam interactions effects in the objective lens.

As known, emission from a TFE cathode (not shown) is only uniform over a limited angle. The upper column embodiment of FIG. 9 optimally uses current passing through upper shape aperture 132, maximizing current while minimizing angle of emission and angular intensity needed from the cathode. Thus, beam current higher than otherwise possible is provided without compromising either uniformity of shape illumination or edge resolution of the line shape.

In addition, it is known that electron - electron or beam interactions in the upper column can be a serious limitation in field emission optics. Astigmatic illumination of embodiments of the upper column optics of the present invention minimize such beam interactions through more efficient use of beam current. Relatively little current is lost on lower shape aperture 136. There are no fully focused crossovers that could cause excessive energy spread in the beam.

Figure 10:
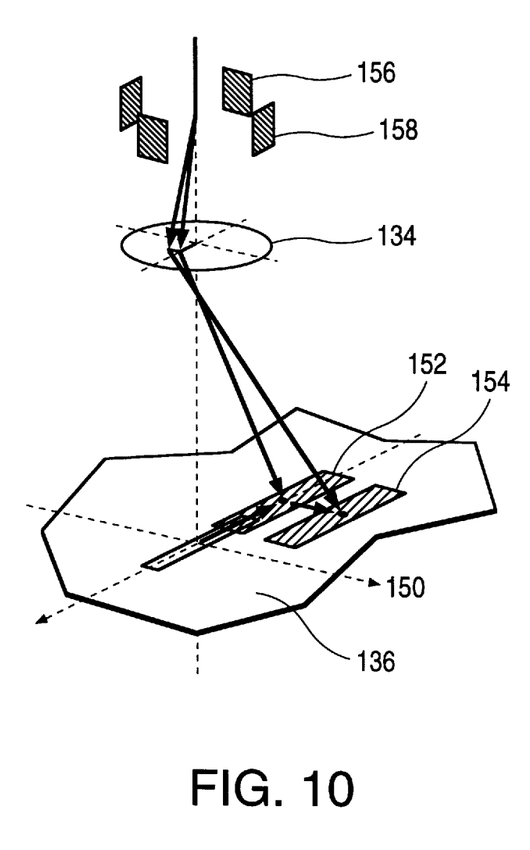
FIG. 10 is a simplified representation of leveraged co-planar blanking and shaping used in an embodiment of the present invention.

FIG. 10 illustrates leveraged co-planar blanking and shaping of embodiments of the present invention. In a line shaped beam, height (narrow axis dimension) of the shape is determined by the fixed width of shape aperture 136. As described, RSB writing strategies only shape the beam in its long axis. This shaping can be performed by deflecting rectangular shadow of the gun aperture 145 (FIG. 9) to position 152 along the long axis of the shape aperture. Orthogonal deflection axis 150 may be used for blanking the beam without influencing either its length or width by deflecting it to position 154. Thus shaping and blanking are co-planer.

Electrostatic shaping deflectors 156 and electrostatic shaping blanking deflectors 158 are located above collimator lens 134. The focal length of collimator lens 134 is short enough to magnify the angular deflection of the deflectors. Along with the terminated strip line configuration of the deflectors 156, 158 this leveraging method of the present invention, allows for low voltage, very high speed deflection to support high flash rates used in embodiments of the RSB writing strategy of the present invention.

While some of the embodiments of the present invention have been described in terms of electron beam lithography, it should be realized that the principles of the writing strategy described, including the electron optical column modifications and enhancements can be used in light optical or other charged particle lithography systems. The scope and spirit of the present invention anticipates such use and therefore includes any light optical or other particle beam application that make use of the teachings and disclosures contained herein.

We claim:

1. A raster scan shaped beam writing strategy for pattern generation comprising the steps of:

providing a substrate coupled to a moveable stage, wherein said stage moves said substrate in a first direction;

providing a column for a beam for exposing a pattern on said substrate, wherein said column for a beam forms a line shaped beam for scanning over said substrate in a second direction orthogonal to said first direction;

creating a first database for said pattern, wherein said first database has a vectorized representation of said pattern defining a plurality of microfields therein, each microfield having a predetermined maximum size;

creating a second database for said pattern from said first database, said second database having a rasterized format of exposure dose data for each of a plurality of writing pixels, and wherein each writing pixel comprises at least one address element;

defining a plurality of stripe data segments from said second database, wherein each stripe data segment has a figure origin field defined therein and segment overlap portions overlying a portion of adjacent stripe data segments wherein said segment overlap portions are larger than the predetermined size of said microfields;

defining a plurality of expanded figure origin fields from said second database, wherein each said expanded figure origin field includes a corresponding stripe data segment and a region about said stripe data segment larger than scattering and/or heating interactions resulting from exposing said writing pixels within said stripe data segment;

defining a plurality of flash origin fields within each figure origin field, each flash origin field having a flash origin, and wherein each flash origin field has a length in said first direction and a width in said second direction and comprises at least two writing pixels such that a length to width ratio is greater than one; and exposing said pattern using said line shaped beam, wherein said line shaped beam is directed over each flash origin field and unblanked over those specific flash origin fields required to form said pattern, wherein unblanking said line shaped beam creates a beam flash, said beam flash having an origin positioned within each specific flash origin field, a height equal to the height of said flash origin field and a variable length no greater than the length of said flash origin field, wherein each beam flash origin is displaced from said flash origin by a flash origin vector having a length no greater than the length of said flash origin field.

2. The raster scan shaped beam writing strategy of claim 1 wherein the step of providing a column for a beam comprises the steps of:

providing an astigmatic illumination of a rectangular shape aperture;

defining a length of said line shaped beam by deflecting said astigmatic illumination in a first axis upon a rectangular shape; and blanking and unblanking said line shaped beam by deflecting said astigmatic illumination along a second axis orthogonal to the first axis, wherein deflecting to define length and deflecting to blank and unblank are coplanar.

3. The raster scan shaped beam writing strategy of claim 1 wherein the step of exposing said pattern using said line shaped beam employs scanning said line shaped beam employing a retrograde scan along the second axis so as to keep said line shaped beam essentially stationary for each said beam flash.

4. The raster scan shaped beam writing strategy of claim 1 wherein creating a beam flash comprises creating said beam flash overlying another flash origin field adjacent to said specific flash origin field in said second direction.

5. The raster scan shaped beam writing strategy of claim 1 wherein creating a beam flash comprises positioning said beam origin employing microvector displacements.

6. The raster scan shaped beam writing strategy of claim 1 wherein creating a beam flash comprises positioning, in said second direction, a feature edge using Graybeam dose modulation.

7. The raster scan shaped beam writing strategy of claim 1 wherein creating a beam flash comprises using a decoder circuit to derive data for length, position and exposure dose data of said beam flash from data for each writing pixel of said specific flash origin field.

* * * * *